(12) United States Patent
Ghassemi Tode Shkchooii et al.

(10) Patent No.: US 12,532,427 B2
(45) Date of Patent: Jan. 20, 2026

(54) HOUSING ASSEMBLY COMPRISING A SEAL

(71) Applicant: Vitesco Technologies GmbH, Regensburg (DE)

(72) Inventors: Ahmad Ghassemi Tode Shkchooii, Munich (DE); Burhan Dagdelen, Munich (DE); Andreas Mühlbauer, Munich (DE); Matthias Schmuderer, Munich (DE)

(73) Assignee: Vitesco Technologies GmbH, Regensburg (DE)

( * ) Notice: Subject to any disclaimer, the term of this patent is extended or adjusted under 35 U.S.C. 154(b) by 281 days.

(21) Appl. No.: 18/548,967

(22) PCT Filed: Mar. 1, 2022

(86) PCT No.: PCT/EP2022/055130
§ 371 (c)(1),
(2) Date: Sep. 5, 2023

(87) PCT Pub. No.: WO2022/184700
PCT Pub. Date: Sep. 9, 2022

(65) Prior Publication Data
US 2024/0164039 A1    May 16, 2024

(30) Foreign Application Priority Data
Mar. 3, 2021  (DE) ..................... 10 2021 202 054.2

(51) Int. Cl.
*H05K 5/06*      (2006.01)

(52) U.S. Cl.
CPC .................................. *H05K 5/061* (2013.01)

(58) Field of Classification Search
CPC ..................................................... H05K 5/061
See application file for complete search history.

(56) References Cited

U.S. PATENT DOCUMENTS

| 9,101,066 B2 | 8/2015 | Azumi et al. | |
| 9,844,140 B2 | 12/2017 | Oba | |
| 2013/0221812 A1* | 8/2013 | Hashimoto | H04N 5/64 312/7.2 |
| 2014/0111917 A1* | 4/2014 | Takita | H05K 5/061 361/679.01 |
| 2014/0118906 A1* | 5/2014 | Hongo | H05K 5/0208 361/679.01 |

(Continued)

FOREIGN PATENT DOCUMENTS

| DE | 102012203222 A1 | 9/2013 |
| DE | 102013207553 A1 | 3/2014 |

(Continued)

*Primary Examiner* — Timothy J Thompson
*Assistant Examiner* — Amol H Patel
(74) *Attorney, Agent, or Firm* — Laurence A. Greenberg; Werner H. Stemer; Ralph E. Locher

(57) ABSTRACT

A housing assembly has a first housing part with a first joining surface in which a groove is formed and a seal which is located in the groove in the first joining surface. The groove has an inner peripheral surface along a peripheral direction of the first housing part and an outer peripheral surface along the peripheral direction of the first housing part. The seal abuts the outer peripheral surface of the groove.

8 Claims, 3 Drawing Sheets

(56) References Cited

U.S. PATENT DOCUMENTS

| | | |
|---|---|---|
| 2016/0262272 A1* | 9/2016 | Oba .................... H05K 5/0052 |
| 2016/0262279 A1 | 9/2016 | Mullaney et al. |
| 2018/0235092 A1 | 8/2018 | Schermann et al. |
| 2020/0072353 A1 | 3/2020 | Bury et al. |

FOREIGN PATENT DOCUMENTS

| | | |
|---|---|---|
| DE | 102013112096 A1 | 5/2015 |
| DE | 102015215102 A1 | 2/2017 |
| DE | 102016123314 A1 | 6/2018 |
| DE | 102018220221 A1 | 5/2020 |

* cited by examiner

HOUSING ASSEMBLY COMPRISING A SEAL

FIELD AND BACKGROUND OF THE INVENTION

The present invention relates to a housing assembly comprising a seal, for example a housing assembly for receiving a battery or sensitive electronic control devices. The seal reliably prevents harmful substances from penetrating into the housing assembly.

FIGS. 3, 4 and 5 show cross-sectional views in the region of a groove 30 of a housing assembly according to the prior art. The housing assembly has a first housing part 100 having a first joining surface 20 in which the groove 30 is formed, and a seal 40 which is located in the groove 30 in the first joining surface 20. The housing assembly furthermore has a second housing part 110, which has a second joining surface 120, which is joined to the first joining surface 20, wherein the seal 40 is in contact with the second joining surface 120. The groove 30 has an inner peripheral surface 50 along a peripheral direction of the first housing part 100 and an outer peripheral surface 60 along the peripheral direction of the first housing part 100. Reference sign 40' describes a contour of the seal 40' in a relaxed state when the second housing part 110 is not abutting the first housing part 100.

FIG. 4 shows that only approximately half of the available installation space in the groove 30 is filled by the seal 40 at low temperatures (for example up to approximately 40° C.). Harmful substances from the external environment may collect in the resultant air gap(s).

FIG. 5 shows the seal 40 in the assembled state and under temperature influence. The seal 40 has expanded and has filled out almost 100% of the installation space in the groove 30, resulting in the disappearance of the air gaps.

Such seals with, as appropriate, a plurality of sealing lips, have, until now, been used for example in aluminum injection-molded housings, in such a way that the seal has local widened portions both in the inner side and on the outer side, so that the seal cannot fall out of the groove. The groove and the seal are formed in such a way that the compression of the seal is ensured at the lowest anticipated temperatures. A gap is provided, which, when the housing and the seal are heated, can be filled up to 100% by the seal.

Especially at low temperatures, salt-containing, aggressive and wet substances may still accumulate depending on the application and may lead to corrosion with subsequent leakage.

SUMMARY OF THE INVENTION

It is the object of the present invention to provide a housing assembly which is better sealed in order to avoid the accumulation of the harmful substances and thus the corrosion with subsequent leakage. This object is achieved by the subject matter of the independent patent claim. The invention is developed according to the subject matter of the dependent patent claims.

A housing assembly according to the present invention has a first housing part having a first joining surface in which a groove is formed, and a seal which is located in the groove in the first joining surface. The groove has an inner peripheral surface along a peripheral direction of the first housing part and an outer peripheral surface along the peripheral direction of the first housing part, wherein the seal abuts the outer peripheral surface of the groove.

In particular, the outer gap can advantageously be avoided, such that the housing assembly is, on the whole, better sealed with respect to external substances. More specifically, the housing assembly is designed such that there is not at any time a gap created on the outer side of the sealed towards the surrounding environment. The existing groove geometry can be filled here to 100% already at the lowest anticipated temperatures outdoors, such that no gap can form. Since it is no longer possible for gaps to form which are reached by substances from the surroundings and could lead to damage as a result of chemical reactions, pitting and leakage can be avoided.

In one exemplary embodiment, the seal abuts the outer peripheral surface at a first temperature and, at least in some portions, does not abut the inner peripheral surface, and wherein the seal at a second temperature, which is higher than the first temperature, abuts both the outer peripheral surface and the inner peripheral surface substantially fully. On the one hand, an air gap on the outer side of the seal can thus be avoided, whereas, on the other hand, there is provided on the inner side of the seal a space in which the seal can expand when heated.

In one exemplary embodiment the seal has at least one clamping region, in which the seal also abuts the inner peripheral surface. In one exemplary embodiment, the seal has, in the clamping region, protrusions which protrude inwards in a radial direction of the first housing part. The seal can thus be prevented from falling out, even at low temperatures.

In one exemplary embodiment the seal has at least one non-clamping region, in which the seal does not abut the inner peripheral surface. A space can thus be provided on the inner side of the seal and the seal can expand in said space when heated.

In one exemplary embodiment at least one relaxation recess is formed on the inner peripheral surface of the groove and is configured to receive a portion of the seal in an expanded state. An air gap on the outer side of the seal can thus furthermore be avoided, whereas there is provided on the inner side of the seal a space in which the seal can expand when heated. Stresses and possible damage to the seal can thus be avoided.

In one exemplary embodiment a plurality of clamping regions and a plurality of relaxation recesses are provided, which are arranged in alternation in a peripheral direction of the first housing part. A homogeneous stress distribution in the seal and a particularly reliable seal can thus be achieved.

In one exemplary embodiment the seal is peripheral and abuts the outer peripheral surface peripherally.

In one exemplary embodiment the housing assembly furthermore has a second housing part, which has a second joining surface, which is joined to the first joining surface, wherein the seal is in contact with the second joining surface.

DESCRIPTION OF EXEMPLARY EMBODIMENTS

Figure 1:
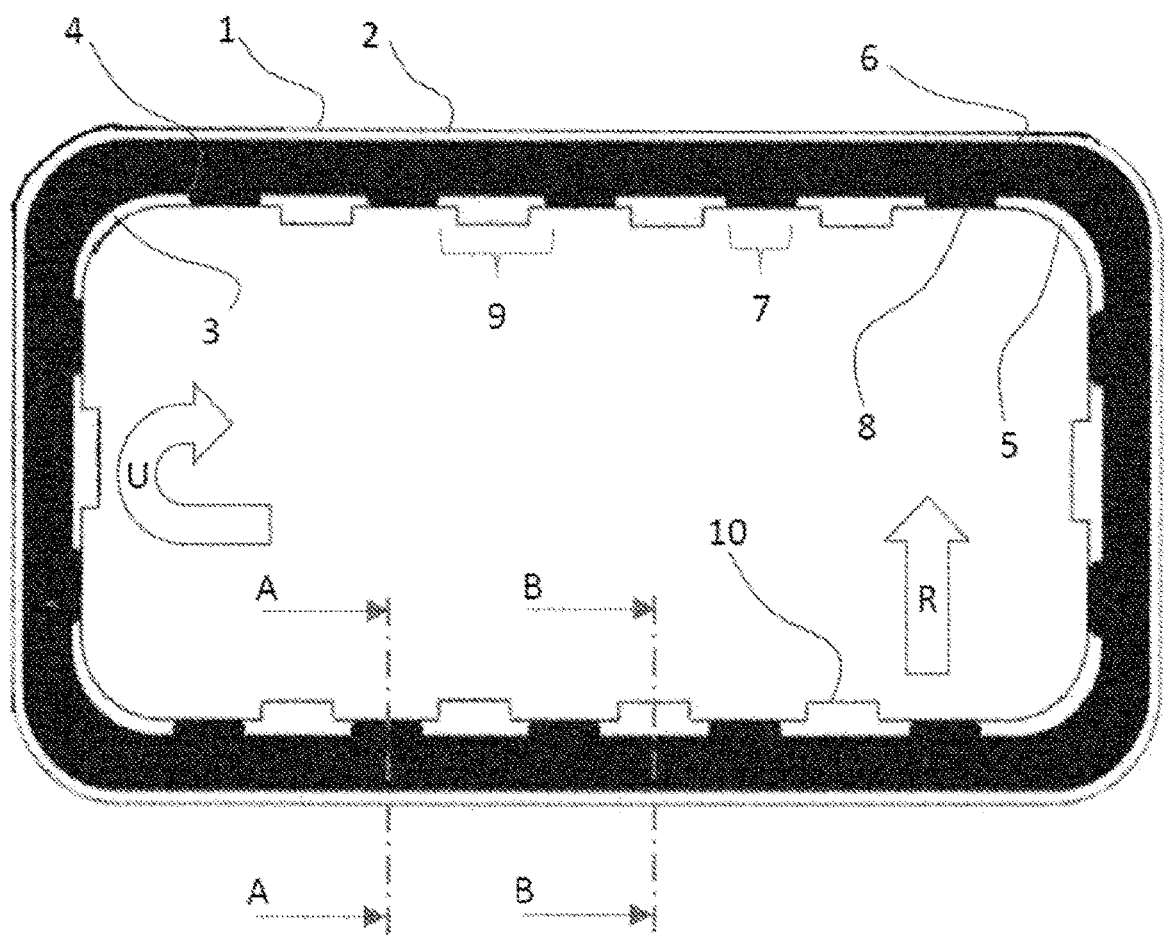
FIG. 1 shows a plan view of a housing assembly according to one exemplary embodiment.
Figure 2:
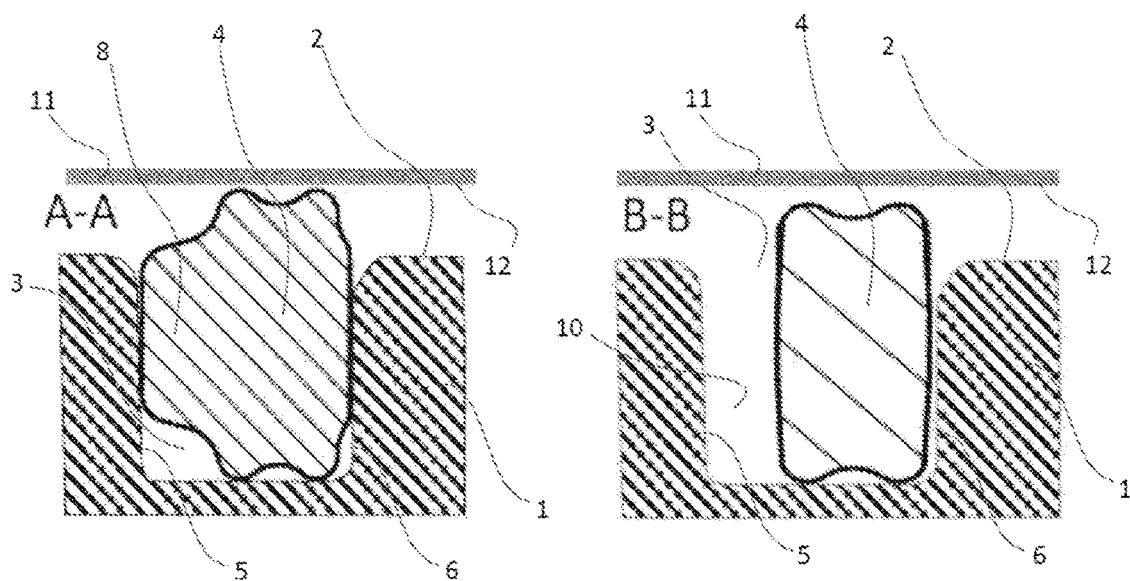
FIG. 2 shows cross-sectional views A-A and B-B in the region of a groove according to an exemplary embodiment in the assembled state.
Figure 3:
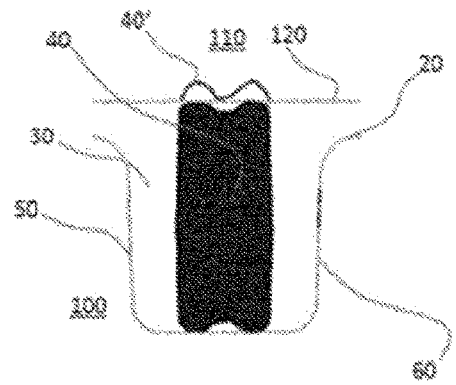
FIG. 3 shows a cross-sectional view in the region of a groove of a housing assembly according to the prior art.
Figure 4:
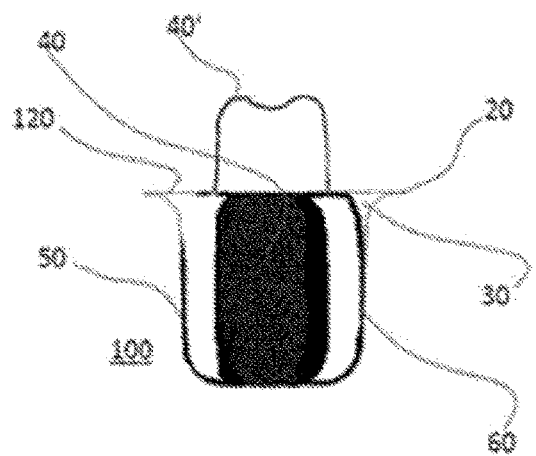
FIG. 4 shows a cross-sectional view in the region of the groove of the housing assembly according to the prior art.
Figure 5:
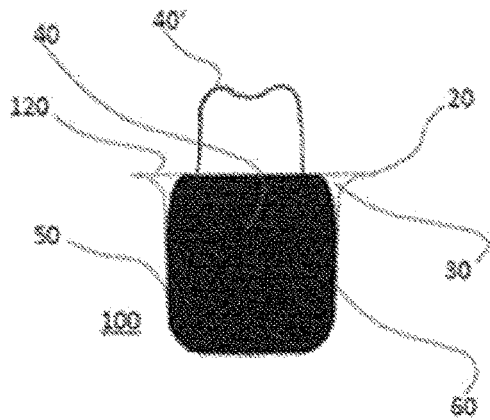
FIG. 5 shows a cross-sectional view in the region of the groove of the housing assembly according to the prior art.

FIG. 1 shows a plan view of a housing assembly according to an exemplary embodiment, and FIG. 2 shows cross-sectional views A-A and B-B in the region of a groove 3 in the inserted state of the seal according to an exemplary embodiment. The housing assembly has a first housing part 1 having a first joining surface 2 in which the groove 3 is formed, and a seal 4 which is located in the groove 3 in the first joining surface 2. The groove 3 has an inner peripheral surface 5 along a peripheral direction U of the first housing part 1 and an outer peripheral surface 6 along the peripheral direction U of the first housing part 1. The seal 4 abuts the outer peripheral surface 6 of the groove 3. In the shown exemplary embodiment the seal 4 is peripheral and abuts the outer peripheral surface 6 of the groove 3 peripherally.

The seal 4 has a plurality of clamping regions 7, in which the seal 4 also abuts the inner peripheral surface 5 of the groove 3. The seal 4 has, in the clamping region 7, protrusions 8 which protrude inwards in a radial direction R of the first housing part 1. The seal 4 additionally has a plurality of non-clamping regions 9, in which the seal 4 does not abut the inner peripheral surface 5.

A plurality of relaxation recesses 10 are formed on the inner peripheral surface 5 of the groove 4 and are configured to receive a portion of the seal 4 in an expanded state. For example, the seal 4 can abut only the outer peripheral surface 6 at a first temperature and, at least in some portions, cannot abut the inner peripheral surface 5. The seal 4 can then substantially fully abut both the outer peripheral surface 6 and the inner peripheral surface 5 at a second temperature, which is higher than the first temperature. So that the stresses by the abutment of the seal 4 against the inner peripheral surface 5 are not excessively high, the relaxation recesses 10 are designed to receive a portion of the seal 4 in the state expanded by compression and heating and thus relieve the stresses in the seal 4.

In one exemplary embodiment a plurality of clamping regions 7 and a plurality of relaxation recesses 10 are provided, which are arranged in alternation in the peripheral direction U of the first housing part 1. A homogeneous stress distribution in the seal 4 and a particularly reliable seal can thus be achieved.

In the exemplary embodiment the peripheral lengths of the clamping regions 7 and of the relaxation recesses 10 are approximately equal and may deviate from one another for example by less than 80%.

The housing assembly usually also has a second housing part 11 (see FIG. 2), which has a second joining surface 12, which is joined to the first joining surface 2, wherein the seal 4 is in contact with the second joining surface 12. The first housing part 1 and the second housing part 11 together form a complete housing, which can be provided for example to receive a battery.

The left view of FIG. 2 shows a cross-sectional view A-A in a clamping region 7, and the right view of FIG. 2 shows a cross-sectional view B-B in a non-clamping region 9. The practically complete filling of the peripheral groove 4 in the clamping region 7 is achieved already at relatively low temperatures. Small regions between the clamping regions 7, i.e. the non-clamping regions 9, are still free and can be filled as the temperature rises further. The relaxation recesses 10 can be used for this purpose.

In the shown exemplary embodiment in FIG. 1, the protrusions 8 are provided one in each of the clamping regions 7. The invention is not however restricted to this, and in a modification the protrusions 8 can be arranged alternatively or additionally in the non-clamping regions 9.

In the shown exemplary embodiment of FIG. 1, both the protrusions 8 and the relaxation recesses 10 can also be formed in the plan view with a rectangular profile. The invention is not however restricted to this, and in a modification protrusions 8 and/or the relaxation recesses 10 can be convexly or concavely rounded, triangular or trapezoidal.

In the shown exemplary embodiment of FIG. 1 the first housing part 1 has two axes of symmetry (center axes) so that the relaxation recesses 10 (and also the protrusions 8 of the seal 4) are opposite one another in pairs. The invention is not, however, restricted to this.

In the shown exemplary embodiment of FIG. 2 the seal 4 has a concave indentation on each of the upper side and lower side. The invention is not however restricted to this, and in a modification the seal 4 can be smooth on the upper side and/or lower side or can have a convex bulge.

The invention claimed is:

1. A housing assembly, comprising:
a first housing part having a first joining surface and a groove formed in said first joining surface;
said groove having an inner peripheral surface along a peripheral direction of said first housing part and an outer peripheral surface along the peripheral direction of said first housing part; and
a seal disposed in said groove in said first joining surface, said seal abutting said outer peripheral surface of said groove;
wherein at a first temperature, said seal abuts said outer peripheral surface and, at least in some portions, does not abut said inner peripheral surface; and
wherein at a second temperature which is higher than said first temperature, said seal abuts both said outer peripheral surface and said inner peripheral surface substantially completely.

2. The housing assembly according to claim 1, wherein said seal has at least one clamping region, in which said seal also abuts said inner peripheral surface.

3. The housing assembly according to claim 2, wherein said seal is formed with protrusions in said clamping region and said protrusions protrude inwards in a radial direction of said first housing part.

4. The housing assembly according to claim 2, wherein said seal is formed with at least one non-clamping region, in which said seal does not abut said inner peripheral surface of said groove.

5. The housing assembly according to claim 2, wherein said inner peripheral surface of said groove is formed with at least one relaxation recess and said at least one relaxation recess is configured to receive a portion of said seal in an expanded state of said seal.

6. The housing assembly as claimed in claim 1, wherein:
said seal has a plurality of clamping regions in which said seal also abuts said inner peripheral surface and a plurality of relaxation recesses configured to receive portions of said seal in an expanded state of said seal; and
said clamping regions and said relaxation recesses are arranged in alternation in the peripheral direction of said first housing part.

7. The housing assembly according to claim 1, wherein said seal is a continuous seal that abuts said outer peripheral surface peripherally without interruption.

8. The housing assembly according to claim 1, further comprising a second housing part having a second joining surface joined to said first joining surface of said first housing part, and wherein said seal is in contact with said second joining surface.

* * * * *